United States Patent
Yang et al.

(10) Patent No.: US 7,035,782 B2
(45) Date of Patent: *Apr. 25, 2006

(54) METHOD AND DEVICE FOR MULTI-INTERVAL COLLOCATION FOR EFFICIENT HIGH ACCURACY CIRCUIT SIMULATION

(75) Inventors: Baolin Yang, Fremont, CA (US); Joel Phillips, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 622 days.

This patent is subject to a terminal disclaimer.

(21) Appl. No.: 09/873,988

(22) Filed: Jun. 1, 2001

(65) Prior Publication Data

US 2003/0144824 A1    Jul. 31, 2003

Related U.S. Application Data

(60) Provisional application No. 60/208,724, filed on Jun. 2, 2000.

(51) Int. Cl.
*G06F 17/50* (2006.01)

(52) U.S. Cl. .................. 703/14; 703/2; 716/6

(58) Field of Classification Search .............. 703/2, 703/14; 716/6, 1; 324/76.39; 708/801
See application file for complete search history.

(56) References Cited

U.S. PATENT DOCUMENTS 5,995,733 A * 11/1999 Roychowdhury .............. 716/6
6,349,272 B1 *  2/2002 Phillips ......................... 703/2

OTHER PUBLICATIONS

Fabien, "Indirect numerical solution of constrained optimal control problems with parameters", IEEE 1995.*

Srinivasan et al., "A multi-criteria approach to dynamic optimization", IEEE 1995.*

Yang et al., "A Pseudospectral method for time-domain computation of electromagnetic scattering by bodies of revolution", IEEE 1999.*

Pasic, "An algorithm for numerical solution of differential-algebraic equations", IEEE 1997.*

Don, Wai Sun and Solomonoff, Alex, "Accuracy and Speed in Computing the Chebyshev Collocation Derivative," *SIAM Journal on Scientific Computing*, Nov. 1995, pp. 1253-1268, vol. 16, No. 6, Society for Industrial and Applied Mathematics, Philadelphia, PA, USA.

Fornberg, Bengt, *A Practical Guide to Pseudospectral Methods*, Feb. 1996, pp. 127-152, 155-160, Cambridge University Press, Cambridge, United Kingdom.

Gilmore, Rowan J. and Steer, Michael B., "Nonlinear Circuit Analysis Using the Method of Harmonic Balance—A Review of the Art. Part 1. Introductory Concepts," *International Journal of Microwave and Millimeter-Wave Computer-Aided Engineering*, 1991, pp. 22-37, vol. 1, No. 1, John Wiley & Sons, Inc.

(Continued)

*Primary Examiner*—Paul L. Rodriguez
*Assistant Examiner*—Kandasamy Thangavelu
(74) *Attorney, Agent, or Firm*—John Carpenter; Reed Smith, LLP (57) ABSTRACT

A method and apparatus are provided for solving a set of differential-algebraic equation arising in a circuit simulation is provided. A collocation method is applied to each differential-algebraic equation to discretize the set of differential-algebraic equations. A solution to the set of differential-algebraic equations based on the discretized differential-algebraic equation is then formed.

40 Claims, 3 Drawing Sheets

OTHER PUBLICATIONS

Gotlieb, David and Orszag, Steven A., *Numerical Analysis of Spectral Methods: Theory and Applications*, 1977, pp. 1-19, 149-153, 159-161, Conference Board of the Mathemetical Sciences.

Hairer, E. and Wanner, G., "Chapter IV. Stiff Problems—One-Step Methods," *Solving Ordinary Differential Equations II: Stiff and Differential-Algebraic Problems*, 1991, pp. 1-39, Springer-Verlag, Berlin, Germany.

Kundert, Kenneth S., "Introduction to RF Simulation and Its Application," *IEEE Journal of Solid-State Circuits*, Sep. 1999, pp. 1298-1319, vol. 34, No. 9, IEEE.

Long, David et al., "Full-Chip Harmonic Balance," *IEEE 1997 Custom Integrated Circuits Conference*, May 1997, pp. 379-382, vol. 16, No. 4, IEEE.

Nastov, Ognen J. and White, Jacob K., "Time-Mapped Harmonic Balance," *Proceedings of the $36^{th}$ Design Automation Conference*, New Orleans, Louisiana, Jun. 1999, pp. 641-646, vol. 36, No. 3, ACM.

Telichevesky, Ricardo et al., "Efficient AC and Noise Analysis of Two-Tone RF Circuits," *Proceedings of the $33^{rd}$ Design Automation Conference*, Jun. 1998, pp. 292-297, vol. 21, No. 3, ACM.

Yang, B. et al., "Spectral Simulations of Electromagnetic Wave Scattering," *Journal of Computational Physics*, Jul. 1997, pp. 216-230, vol. 134., No. 2, Academic Press Professional, Inc., San Diego, CA, USA.

* cited by examiner

METHOD AND DEVICE FOR MULTI-INTERVAL COLLOCATION FOR EFFICIENT HIGH ACCURACY CIRCUIT SIMULATION

This application claims the benefit of Provisional Application No. 60/208,724, filed Jun. 2, 2000.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of Invention

The present invention relates generally to analyzing integrated circuits and, more particularly, to techniques for performing simulations of radio frequency (RF) integrated circuits.

2. Discussion of Background

The exploding demand for high performance wireless products has increased the need for efficient and accurate simulation techniques for RF integrated circuits. RF circuit simulation is difficult because RF circuits typically contain signals with multiple-timescale properties, as usually the data and carrier signals in a system are separated in frequency by several orders of magnitude. Special-purpose RF simulators exploit the sparsity of the spectrum in order to make the computations tractable. See K. S. Kundert, "Introduction to RF Simulation and Its Applications," IEEE J. Sol. State Circuits, September 1999. For example, instead of performing a long transient analysis of a circuit driven by a periodic source, we may seek to find the steady-state directly. Unfortunately, periodic-steady-state computation may be problematic in that it can be inefficient and inaccurate using conventional methods.

Two numerical methods commonly used in steady-state computation are the shooting-Newton method, based on low-order finite difference discretizations such as the second-order Gear method (see K. S. Kundert, "Introduction to RF Simulation and Its Applications," IEEE J. Sol. State Circuits, September 1999), and the harmonic balance method, based on high-order spectral discretizations (see "Nonlinear Circuit Analysis Using The Method of Harmonic Balance-A Review of The Art," Part I-Introductory Concepts, Int. J. Microwave and Millimeter Wave Computer Aided Engineering, vol. 1, no. 1, 1991).

An advantage of the low-order polynomial-based methods is that these methods can select time-points based on localized error estimates and as a result can easily handle sharp transitions in circuit waveforms. The harmonic balance method, on the other hand, has the advantage of attaining spectral accuracy for smooth waveforms. Recent developments in matrix-free Krylov-subspace algorithms have made these methods even more popular as they can be used to analyze circuits with thousands of devices. For more information on matrix-free Kylov-subspace algorithms, see R. Telichevesky, K. Kundert and J. K. White, "Efficient AC and Noise Analysis of Two-Tone RF Circuits," Proc. 33rd Design Automation Conference, June, 1996; D. Long and R. Melville and K. Ashby and B. Horton, "Full Chip Harmonic Balance," Proc. Custom Integrated Circuits Conference, May, 1997.

High precision computations are often necessary in RF circuit simulation. For example, accurately computing the noise figure of a highly nonlinear RF circuit often requires accurate determination of the periodic operating point up to many multiples of the fundamental frequency, as noise may be translated from very high frequencies by the mixing action of the time-varying circuit elements to appear at the output.

High accuracy is easy to achieve for smooth waveforms using spectral approximation in the harmonic balance method. However, non-linear circuits often produce waveforms that have sharp-transition regions. The waveforms may only be $C^0$ in the case of a pulse, which means that the waveforms are continuous but the derivatives of the waveforms are not continuous at some points. In this case, the spectral accuracy of the harmonic balance method is lost and acceptable accuracy is obtained only at the cost of including very many harmonics and/or timepoints in the simulation.

To help handle sharp transitions, Nastov and White introduced the time-mapped harmonic balance (TMHB) method. See O. J. Nastov and J. K. White, "Time-Mapped Harmonic Balance," Proc. 36th Design Automation Conference, New Orleans, La., June, 1999. In the TMHB method, a time-map function is used to map the solution in the original time space to a space where the solution is more smooth. This method is an improvement over traditional harmonic balance, but is still restricted, since, theoretically speaking, a $C^0$ point in the original time space is still a $C^0$ point in the mapped time space, and so one still cannot achieve spectral accuracy. Basically, the TMHB method can only put more points around the $C^0$ points to localize the oscillations inevitably associated with using a spectral method to approximate $C^0$ functions. And, as with all methods that utilize global basis functions, for reasons of numerical stability there are also strong restrictions on how rapidly the timestep can be changed locally.

The low-order multi-step methods, such as the Gear methods, typically used in the shooting method offer excellent flexibility in locally adapting the timesteps. For low to moderate accuracy, these methods are preferred for problems that are highly nonlinear and/or contain sharp transitions. However, low-order multi-step methods are not efficient at high precision because very fine discretizations are needed, resulting in loss of speed and increased memory requirements. In addition, the multistep discretizations used in the shooting method must be causal, and so have stability problems associated with using one-side approximations, namely, performing differentiation using backward differences. It is generally accepted that multistep methods of order greater then three or four are not sufficiently stable, and in practice even the third order methods have relatively stringent stability restrictions on how rapidly timesteps may be varied. As a result, multi-step methods of order higher than 2 are not widely used in circuit simulation. Often, because of the backward-looking nature of the approximation, it is necessary to decrease the order after sharp-transition points or $C^0$ points, often to first order, resulting in very fine grids in those regions.

In sum, most RF circuit analysis tools use either shooting-Newton or harmonic balance methods. Unfortunately, neither method can efficiently achieve high accuracy on strongly nonlinear circuits possessing waveforms with rapid transitions.

SUMMARY OF THE INVENTION

It has been recognized that what is needed is a method for performing efficient, highly accurate radio frequency circuit simulation. Broadly speaking, the present invention fills these needs by providing a method and device for multi-interval Chebyshev collocation. It should be appreciated that the present invention can be implemented in numerous ways, including as a process, an apparatus, a system, a device or a method. Several inventive embodiments of the present invention are described below.

The present invention provides a multi-interval-Chebyshev (MIC) method for solving boundary-value differential-algebraic equations arising in radio frequency (RF) circuit simulation. The varying-order, varying-timestep MIC scheme effectively adapts to different types of waveforms that appear in circuit simulation. The method has spectral accuracy for smooth wave-forms. In some embodiments, the method is efficient in resolving sharp transitions and non-linear effects with high accuracy. Note that purely low-order schemes have difficulty achieving accuracy at reasonable cost, and high-order methods such as harmonic balance lose accuracy due to oscillations in sharp-transition regions. Preconditioning techniques are presented herein that make the cost of the present scheme comparable to backward differential formula-based (BDF-based) shooting-Newton methods.

In one embodiment, a method of simulating a circuit is provided. The method comprises the following: defining a differential-algebraic equation of the circuit; defining a simulation time interval corresponding to the differential-algebraic equation; dividing the simulation time interval into time intervals, wherein the time intervals have corresponding polynomials for each time interval, wherein each polynomial is a portion of an approximation to a desired solution of the differential-algebraic equation; and applying a collocation method to discretize the differential-algebraic equation.

In another embodiment, a method of solving a set of differential-algebraic equation arising in a circuit simulation is provided. The method comprises the following: applying a collocation method to each differential-algebraic equation to discretize the set of differential-algebraic equations; and forming a solution to the set of differential-algebraic equations based on the discretized differential-algebraic equation.

Advantageously, the present invention provides a method for efficient, high-accuracy radio frequency (RF) circuit simulation. Because of inevitable discontinuities in the solution waveforms, residuals, or device equations, the discretization is performed by breaking the simulation interval, of length T, into m timestep intervals of length $h_s$, s=1 . . . m. Within each interval, Chebyshev polynomials are used to represent the solution waveform. Chebyshev polynomials have excellent approximation properties, in particular showing spectral convergence as the order is increased. The method of the present invention has several desirable properties that lead to an excellent tradeoff between efficiency and accuracy. Further, the method can be easily combined with matrix-implicit Krylov-subspace techniques to allow analysis of large circuits. In a sense, the best characteristics of the shooting-Newton and harmonic-balance methods are exploited, without the drawbacks of either.

BRIEF DESCRIPTION OF THE DRAWINGS

The present invention will be readily understood by the following detailed description in conjunction with the accompanying drawings. To facilitate this description, like reference numerals designate like structural elements.

DESCRIPTION OF THE PREFERRED EMBODIMENTS

An invention is disclosed for a method and device for multi-interval Chebyshev collocation for efficient, highly accurate radio frequency circuit simulation. Numerous specific details are set forth in order to provide a thorough understanding of the present invention. It will be understood, however, to one skilled in the art, that the present invention may be practiced without some or all of these specific details.

General Overview of Circuit Equation Discretization

Circuit behavior is usually described by a set of N nonlinear differential-algebraic equations (DAEs) that can be written as $$\frac{dQ(v(t))}{dt} + I(v(t)) + u(t) = 0, \quad (1)$$

where $Q(v(t))$ represents contribution of the dynamic elements such as inductors and capacitors, $I(v(t))$ is the vector representing static elements such as resistors, $u(t)$ is the vector of inputs, and the vector $v(t)$ contains state variables such as node voltages. The periodic steady-state solution is the solution of Eq. (1) that also satisfies the two-point boundary condition $v(T)-v(0)=0$ for some period T.

We now contrast three ways of discretizing the time-derivative operator: linear multistep methods, harmonic balance methods, and Chebyshev methods. As representative of linear multistep methods we consider the Gear methods. Given the values, $u(t_j)$, at the time points: $t_j$, j=0, 1, . . . ,M, to perform the discretization at $t=t_k$, we seek an interpolating polynomial of degree p based on $u(t_j)$, j=k−p, k−p+1, . . . , k. The time derivative is approximated by evaluating the derivative of the interpolating polynomial at $t=t_k$. Thus, the time-derivative of the approximate solution is required to match the differential equation at the point $t_k$. We call such a point a collocation point.

The Gear methods are implicit in only "one-point-at-a-time". They are called one-stage methods. At each time-point, for a method of order p, the solution vector at only p+1 points is involved, and if p previous timepoints are known, a nonlinear system of size N must be solved to find the solution at the next timepoint. Each step of a shooting method involves the factorization of the circuit Jacobian matrix. Because this matrix is usually very sparse, it can be factored with few fill-ins, in nearly O(N) time. The order of polynomial approximation p is usually fixed at a low value, and increased accuracy is obtained by locally changing the timesteps based on estimates of the truncation errors induced by the order-p polynomial approximation. Note that higher-order Gear methods can not be used at points after $C^0$ or sharp-transition points because approximation of the differential operator using a p-order Gear method involves p preceding points. Higher-order approximation across $C^0$ points or sharp-transition points leads to oscillation of the solution and makes the solution even less accurate than a first-order solution. A similar problem occurs if the timestep ratios are changed too rapidly.

For contrast, consider a particular (time-domain) construction of the harmonic balance method, known as Fourier-collocation. We seek to form the solution u(t) by an interpolating trigonometric polynomial of degree M:

$$I_M u(t) = \sum_{k=-M}^{M-1} \tilde{u}_k e^{ikt} \tag{2}$$

where $I_M$ denotes an M-point interpolation operator. By computing the derivative of the trigonometric polynomial $$(I_M u)'(t) = \sum_{k=-M}^{M-1} ik \tilde{u}_k e^{ikt}, \tag{3}$$

at the Fourier collocation points $t_j$, $$t_j = \frac{\pi j}{M},$$

j=0, . . . , 2M−1, and enforcing the differential equation at these points we have specified the numerical method. We may solve for the Fourier coefficients directly, or express the Fourier coefficients in terms of the values $u(t_j)$ at the Fourier collocation points as $$\tilde{u}_k = \frac{1}{2M} \sum_{j=0}^{2M-1} u(t_j) e^{-ikt_j}. \tag{4}$$

The differentiation procedure may be performed efficiently to high order by noting that in the frequency domain, the differentiation operator becomes a multiplication operator, so by using the FFT to convert the $u(t_j)$ to $\tilde{u}_k$, performing the differentiation, then in-verse transforming, one may accomplish the time-derivative operation in $O(M \log_2 M)$ operations. Alternatively, one may use this prescription to obtain a time-domain differentiation matrix D such that DV approximates the value of $$\frac{d v(t)}{d t}$$

at the collocation points, where vector V is a vector of the values of v(t) at the collocation points. Then the derivatives can be obtained directly by a matrix-vector multiplication DV, requiring $O(M^2)$ operations. Note that, in practice, using the FFT does not provide much advantage over using the D matrix explicitly unless the order of approximation M is fairly large.

Accuracy in the harmonic balance method is usually achieved by increasing the order of approximation. For a given set of collocation points, the maximal possible order of approximation is used. With $C^\infty$ waveforms, this has the very desirable effect of achieving spectral convergence, meaning that as the spacing between the collocation points decreases, asymptotically the error decreases faster than any polynomial approximation (in particular, faster than the Gear methods). However, note that although the expansion in Fourier series conveniently means automatically enforcing the periodic boundary condition, it also means that the basis functions, sines and cosines, must cover the entire domain. Unlike the Gear methods, which couple only local points, every point in the solution interval [0, T] is coupled to every other through each basis function. The spectral convergence of the Fourier series is very desirable for smooth waveforms and nearly linear circuits, but unfortunately, a single discontinuous point can destroy the spectral convergence properties. Because of the global nature of the basis functions, spectral convergence is very difficult to recover once interrupted. Most semiconductor device models possess some degree of discontinuity in the derivatives, and so true spectral convergence is rarely observed in practice.

Chebyshev Polynomials

A preferred class of basis functions that also possess good approximation properties, including the possibility of spectral convergence property, are the Chebyshev polynomials. However, Chebyshev polynomials have the advantage that they can be applied when the simulation domain has been decomposed into multiple intervals in order to resolve complex or singular behavior, as has been done for electromagnetic wave problems in complex geometries. For more information on electromagnetic wave problems in complex geometries, see B. Yang, D. Gottlieb and J. S. Hesthaven, "Spectral Simulations of Electromagnetic Wave Scattering," J. Comput. Phys., vol. 135, pp. 216–230, 1997.

The following discussion provides the basics of the Chebyshev collocation method. Given the values, $u(t_j)$, at the Chebyshev Gauss-Lobatto collocation points, $$t_j = \cos\frac{\pi j}{M},$$

j=0, . . . , M, an interpolating polynomial of degree M is sought:

$$I_M u(t) = \sum_{k=0}^{M} \tilde{u}_k T_k(t), \tag{5}$$

and compute the derivative of the polynomial as $$(I_M u)'(t) = \sum_{k=0}^{M} \tilde{u}'_k T_k(t). \tag{6}$$

The coefficients, $\tilde{u}'_k$, are computed from the coefficients $\tilde{u}_k$ by using the backward recurrence relation.

$$\tilde{u}'_{M+1} = \tilde{u}' = 0 \qquad (7)$$

$$c_k \tilde{u}'_k = \tilde{u}'_{k+2} + 2(k+1)\tilde{u}_{k+1}, \quad k = 1, 2, \ldots, M-1$$

$$\tilde{u}'_0 = \tilde{u}'_2 + 2\tilde{u}_1.$$

For more detail, see B. Formberg, "A Practical Guide to Pseudospectral Methods," Cambridge University Press, 1996.

We can also obtain a derivative matrix D by noting that the interpolating polynomial can be expressed in terms of a Lagrange inter-polation polynomial $g_j(t)$. The entries of the Chebyshev differentiation matrix D are computed by taking the analytical derivative of $g_j(t)$ and evaluating it at the collocation points $t_k$ for j, k=0, . . . , M, i.e., $D_{kj}=g'_j(t_k)$.

The entries of the matrix are $$D_{kj} = \frac{c_k}{c_j} \frac{(-1)^{j+k}}{c_j(t_k - t_j)}, \quad j \neq k, \qquad (8)$$

$$D_{kk} = -\frac{1}{2} \frac{t_k}{(1-t_k^2)}, \quad k \neq 0, M,$$

$$D_{00} = -D_{MM} = \frac{2M^2 + 1}{6},$$

where $c_k=2$ when k=0, M and $C_k=1$ otherwise. It is pointed out in W. S. Don and A. Solomonoff, "Accuracy and Speed in Computing the Chebyshev Collocation Derivative," IMA technical report, that calculating the matrix directly in this form results in unnecessarily large numerical error, and a formulation that yields more accuracy is given.

An important aspect of the multi-interval Chebyshev (MIC) approach is to break the simulation domain [0, T] into multiple intervals, [0, $T_1$], [$T_1$, $T_2$], . . . , [$T_m$, T]. In each interval [$T_i$,$T_{i+1}$] the Chebyshev collocation method is used to discretize the differential equation. Continuity of the solution is enforced at the boundaries of any two intervals. For the first and last interval, this has the effect of enforcing the periodic boundary condition. The reason this decomposition is useful is that waveforms in circuit simulation typically have regions of different properties. There are smooth regions where high-order methods can be used and there are sharp-transition regions where interval boundaries must be placed. Our particular combination of high-order Chebyshev discretizations in multiple time intervals provides several important advantages.

First, as in harmonic balance, high accuracy is achievable because in each interval all the desirable approximation properties of Chebyshev polynomials can be exploited. Chebyshev polynomials are usually close to the optimal polynomial approximation of a given order, and spectral convergence can be achieved if order-based (p-type) refinement is used in each interval. Because of the rapid convergence, once a proper set of intervals is chosen high accuracy can be obtained at little marginal cost. Conversely, there will be few intervals in regions where the solution is smooth, because the intervals there can be quite large.

Second, as in the lower-order finite difference schemes, the timestep intervals can be adaptively chosen to resolve nonlinear or abrupt transition behavior. The impact of nonlinear behavior can some-times be difficult to diagnose. Solution waveforms, such as voltages, may be quite smooth, but residuals, such as currents, will be much more difficult to represent with a Fourier series if the circuit equations are very nonlinear. In the MIC method, if the intervals are chosen such that discontinuities occur only at the interval boundaries, then the discontinuities can be handled efficiently. Around a transition or strongly nonlinear region, more intervals can be placed in a denser timestep spacing, and possibly the order of the method lowered.

Third, the method has excellent numerical stability properties. It can be shown that the scheme of the present invention is a member of a particular class of implicit Runge-Kutta (IRK) methods, the collocation-IRK methods. For more information on solving differential equations, see E. Hairer and G. Wanner, "Solving Ordinary Differential Equations II," Springer-Verlag, 1991. Higher-order implicit Runge-Kutta methods are multi-stage methods, that is, they are implicit in more than one point at a time. Because of the multiple implicit states, and unlike multi-step methods such as the Gear methods, IRK methods can be constructed that are A-stable even at high order. A-stable means a scheme that is numerically stable for systems with poles located anywhere in the left-half-plane, including the entire imaginary axis. The particular schemes used in this discussion are not A-stable, but it has been proved that the schemes of all orders used here are what is called A($\alpha$)-stable, meaning that if $\lambda$ is a pole of the system being integrated, then the numerical scheme is stable with timestep h for all z=h$\lambda$ in the left-half-plane, except possibly within an angle $\alpha$ of the imaginary axis. For the methods of the present invention, $\alpha$ is usually less than one degree, and the stability region only excludes a small semi-circle near the imaginary axis, which can be avoided by appropriate choice of timesteps.

In addition, because the Gauss-Lobatto-Chebyshev points are preferred for collocation (implying a collocation point is always placed at the forward interval boundary), the particular construction here gives methods that are L- or stiffly stable, just as the Gear methods are. Accordingly, the method is suitable for solving differential-algebraic equations as initial value problems. This property allows the use of shooting techniques to solve boundary value problems or construct preconditioners. In fact, in a certain sense that is important in practical applications, the MIC approach is more stable than the Gear methods. Since unlike the Gear methods, the MIC scheme retains excellent stability properties even when the timesteps are rapidly varied, higher-order schemes can be used near sharp transition points. Finally, the discretization scheme is robust. Unlike harmonic balance schemes, where sufficiently sharp transitions can induce oscillations in the global basis that are next to impossible to eliminate, in the worst possible case the discretization in a single MIC interval degenerates to the backward-Euler scheme which is robust and well-tested. In practice, the need to drop below the second order scheme is rare.

Efficient Implementation of Chebyshev Collocation Methods

For simplicity of presentation, the following discussion involves Chebyshev-collocation methods for the case of two intervals: $I_1$=[0, $T_1$] and $I_2$=[$T_1$,T]. The number of collocation points in $I_1$ is L and the number of collocation points in $I_2$ is M. The solution in $I_1$ is represented by V=$V_0$, $V_1$, $V_1$, . . . , $V_L$ and the solution in $I_2$ is represented by $\tilde{V}=\tilde{V}_0$, $\tilde{V}_1$, . . . , $\tilde{V}_M$. The continuity condition $\tilde{V}_L=\tilde{V}_0$ is enforced at the internal interval boundary, and the periodicity condition $\bar{V}_0 = \tilde{V}_M$ relates the two interval endpoints. Assume that $\bar{D}=(\bar{d}_{ij})$ |i,j=0,1, ..., L is the differentiation matrix in $I_1$ and $\tilde{D}=(\tilde{d}_{ij})$ |i,j=0,1, ..., M is the differentiation matrix in $I_2$, Eq. (1) is discretized into the following equation:

$$\begin{bmatrix} \bar{d}_{11}I & \cdots & \bar{d}_{1L}I & 0 & 0 & \bar{d}_{10}I \\ & \cdots & & & & \\ \bar{d}_{L1}I & \cdots & \bar{d}_{LL}I & 0 & 0 & \bar{d}_{10}I \\ 0 & 0 & \tilde{d}_{10}I & \tilde{d}_{11}I & \cdots & \tilde{d}_{1M}I \\ & & & \cdots & & \\ 0 & 0 & \tilde{d}_{M0}I & \tilde{d}_{M1}I & \cdots & \tilde{d}_{MM}I \end{bmatrix} Q + I + U = 0, \quad (9)$$

$$I + U = 0.$$

where I is the identity matrix. Newton's method is used to solve this nonlinear equation. By defining the matrices $$C = \frac{\partial Q}{\partial V}, \quad G = \frac{\partial I}{\partial V}, \quad (10)$$

at each collocation point we can write the Jacobian matrix J for the Newton iteration as $$\begin{bmatrix} \bar{d}_{11}\bar{C}_1 + \bar{G}_1 & \cdots & \bar{d}_{1L}\bar{C}_L & 0 & \cdots & 0 \\ & \cdots & & & & \\ \bar{d}_{L1}\bar{C}_1 & \cdots & \bar{d}_{LL}\bar{C}_L + \bar{G}_L & 0 & \cdots & 0 \\ 0\cdots & 0 & \tilde{d}_{10}\tilde{C}_0 & \tilde{d}_{11}\tilde{C}_1 + \tilde{G}_1 & \cdots & \tilde{d}_{1M}\tilde{C}_M \\ & & & \cdots & & \\ 0\cdots & 0 & \tilde{d}_{M0}\tilde{C}_0 & \tilde{d}_{M1}\tilde{C}_L & \cdots & \tilde{d}_{MM}\tilde{C}_M + \tilde{G}_M \end{bmatrix} \quad (11)$$

Note that $\bar{C}_0 = \tilde{C}_M$ and $\bar{C}_L = \tilde{C}_0$.

At each Newton iteration step, we must solve a linear system $$J \Delta U = -E, \quad (12)$$

where E is the residual of the previous solution. This step is problematic because in each interval the discretization of the differentiation operator is global. That is, the approximation of $$\frac{dq(v)}{dt}$$

at every collocation point involves $q(v(t_i))$ at all the collocation points $t_i$. Consequently, the differentiation matrix, like the Fourier collocation differentiation matrix, is a full matrix (on each interval). The resulting larger, less-sparse equations systems lead to difficulties in large-scale circuit simulation and is the reason IRK methods are not widely used to date. Ironically, it is the sheer scale of RF simulation problems that makes IRK methods more suitable in the RF context. Matrix-implicit Krylov subspace methods, such as Generalized Minimum Residual (GMRES) or Quasi-Minimal Resudual (QMR), are now commonly used to simulta-neously solve the linear system of equations (Eq. 11) resulting from discretization of the circuit equations over a fundamental period T. The present invention shows that it is possible to easily construct a preconditioner that is more effective than those typically used in harmonic balance and comparable to the preconditioners used for shooting methods, thereby assuring rapid convergence of the iterative solvers. For example, on a similar test (the DC—DC converter), with a comparable approach to preconditioner construction, the method of the present invention requires two orders of magnitude fewer GMRES iterations than reported by O. J. Nastov and J. K. White, "Time-Mapped Harmonic Balance," Proc. 36th Design Automation Conference, New Orleans, La., June, 1999.

In each interval a "local" preconditioning approach is preferred that is motivated by techniques used for large-scale harmonic balance analysis. But because [0, T] is decomposed into multiple intervals, a preconditioner can be devised that is much more efficient than the corresponding harmonic balance preconditioner. In this way, the "global" preconditioning approach is similar to that used in R. Telichevesky, K. Kundert and J. K. White, "Efficient AC and Noise Analysis of Two-Tone RF Circuits," Proc. 33rd Design Automation Conference, June, 1996, for shooting methods, where a preconditioner is obtained for finite difference equations by dropping the top-right corner entries in the left-hand-side matrix of the linear system.

In harmonic balance, it is common to construct a preconditioner by assuming the capacitance and conductance matrices C, G respectively can be well represented by (piecewise) constant approximations. Both these techniques are adopted in the present invention. For example, a single $\bar{C}$ is used as an approximation of all the capacitance matrices in interval $I_1$ and $\tilde{C}$ as an approximation of all the capacitance matrices in interval $I_2$, the conductance matrices being treated similarly. When this is done, note that the two large blocks of the preconditioning matrix corresponding to the two intervals are only coupled by the subdiagonal block. Hence, it suffices to discuss how to invert the top diagonal block. To accomplish this inversion method, consider forming the Schur decomposition of the relevant portion of the Chebyshev differentiation matrix such that $$[\bar{d}_{ij}|_{i,j=1,2,\ldots,M}] = UTU^T, \quad (13)$$

where T is a Schur matrix and U is a unitary matrix. T has 2-by-2 blocks on the diagonal and all other subdiagonal entries are zeros. By applying this decomposition to the top block of J, one can reduce it to an almost upper block-triangular structure with 2N-by-2N blocks on the diagonal. These 2N-by-2N blocks on the diagonal can be further transformed into an N-by-N complex matrix that has the same sparsity structure as a single-timepoint circuit Jacobian as generated in a transient analysis. It can be factored efficiently, with few fill-ins, just as the Jacobian matrix in a low-order method.

The advantage of this preconditioner over harmonic balance preconditioners is that one can approximate the capacitance and conductance matrices with averages separately in each interval at little computational cost, in contrast to using global averages which make the preconditioner very inefficient in simulations of nonlinear circuits. Because the intervals are chosen to resolve the nonlinear behavior, we can expect the cost of applying the preconditioner to be relatively independent of the degree of nonlinearity of the circuit. If the circuit is very nonlinear, there will be very many intervals, yet precisely for this reason the preconditioner will still be a good approximation to the original matrix, and in fact will be nearly as cheap to apply as the shooting-method preconditioner.

In a practical implementation directly solving the MIC equations is not preferred. Instead, a low-order shooting-Newton method is used to obtain an initial approximation to the solution waveform. For steady-state problems, the shooting-Newton method has a good global convergence rate in periodic steady state (PSS) simulations and can rapidly reach the neighborhood of the steady state.

From the result of the low-order solution method, the time interval [0, T] is decomposed into a number of subintervals. The objective of this first decomposition is to avoid sharp transitions and $C^0$ points in each interval. Next, the order of accuracy desired in each interval is determined. At this point, if an interval contains many time points of the low-order shooting method, the solution in this interval must be relatively smooth, and a relatively high order in this interval will be chosen. If an interval contains only a few time points, it means the interval is in a sharp-transition region and low-order IRK methods in the interval can be chosen. Once the circuit equations have been discretized in all the intervals, and the boundaries are connected with continuity conditions and the periodicity conditions, then the Newton iteration can proceed.

Once an initial solution is obtained, an adaptive refinement scheme is used to split the intervals in any additional sharp-transition regions that may appear and increase the order of approximation in other regions where accuracy is not satisfactory. In this stage, both h-type (interval decomposition) and p-type (order increase) refinement are used to achieve the required accuracy in the most efficient way.

Error control can be performed by examining the trailing Chebyshev coefficients as indicators of potential numerical truncation error. Initial experiments have been conducted using the following simple error criteria, $$\left(\frac{C_{N_s-1}}{N_s} + C_{N_s}\right) h_s / T < \epsilon, \quad (14)$$

where $N_s$ is the order of the Chebyshev method used in inerval s, $c_{N_s-1}$ and $c_{N_s}$, are the $N_s$-1th and $N_s$th th Chebyshev expansion coefficients, normalized by the local maximum in all intervals, $h_s$ is the length of the interval, T is the time period, and a is the desired level of accuracy. This takes into account both h-type refinement, $h_s/T$, and the p-type refinement, $$\frac{c_{N_s-1}}{N_s} + C_{N_s},$$

which is proven to be effective in numerical experiments. If the error criteria is not satisfied in a given interval, then we check the absolute value of $C_{N_s-1}$ and $C_{N_s}$. If $|C_{N_s-1}|>|C_{N_s}|$, we increase the order of the method in the interval, as this indicates that the order of Chebyshev coefficients is decreasing, so it is reasonable to seek spectral convergence. Otherwise, the solution is likely non-smooth, and we decompose the interval into two new intervals at the middle point.

Numerical Results

In this section, the spectral accuracy of the multidomain Chebyshev collocation method in periodic steady state computations is provided. Efficiency of using h-type (domain decomposition) and p-type (polynomial order increase) refinement in resolving waveforms with sharp transitions is shown. The method's ability to resolve sharp transitions with high accuracy is verified. The efficiency of the preconditioning technique is also demonstrated by the solution of the linear system using the matrix-free Krylov-subspace approach.

In the first example, the spectral accuracy of the multi-domain Chebyshev collocation methods is shown by computing the periodic steady-state solution of a crystal filter.

Figure 1:
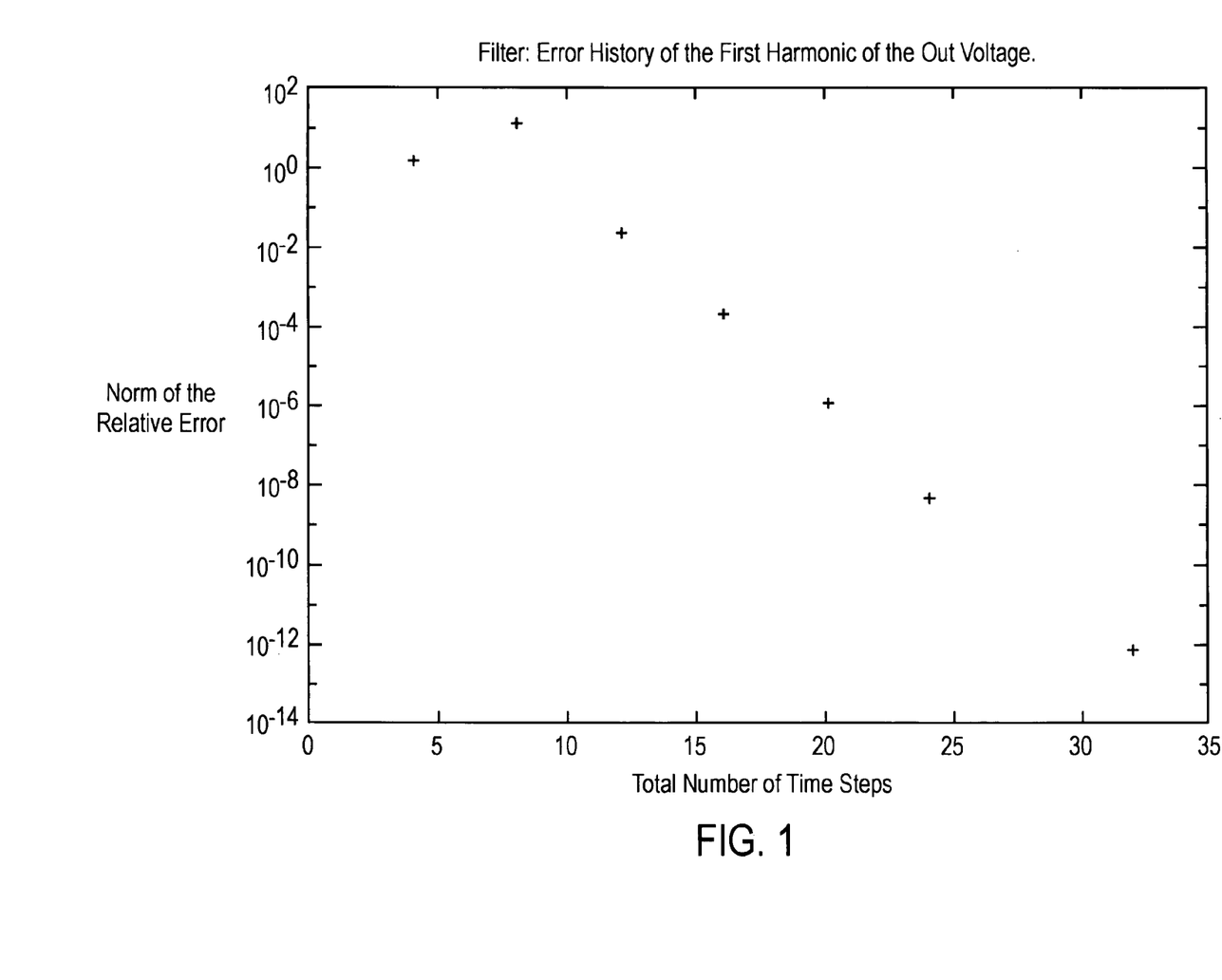
FIG. 1 is a graph showing spectral accuracy of a multi-domain Chebyshev collocation method, in accordance with one embodiment of the present invention.

FIG. 1 shows how the method of the present invention can achieve machine precision using only 32 time points (we use 2 intervals and 16th order in each interval), in accordance with one embodiment of the present invention. Spectral convergence is evident in the exponential decay of the error.

In the second example, the efficiency of using both h-type and p-type refinement in resolving solutions with sharp transitions is provided. Nonlinearity is introduced into the previous filter example by placing a mixer before it. Three refinement strategies are compared: h-type refinement only, p-type refinement only, and hp-type (h-type and p-type) refinement.

Figure 2:
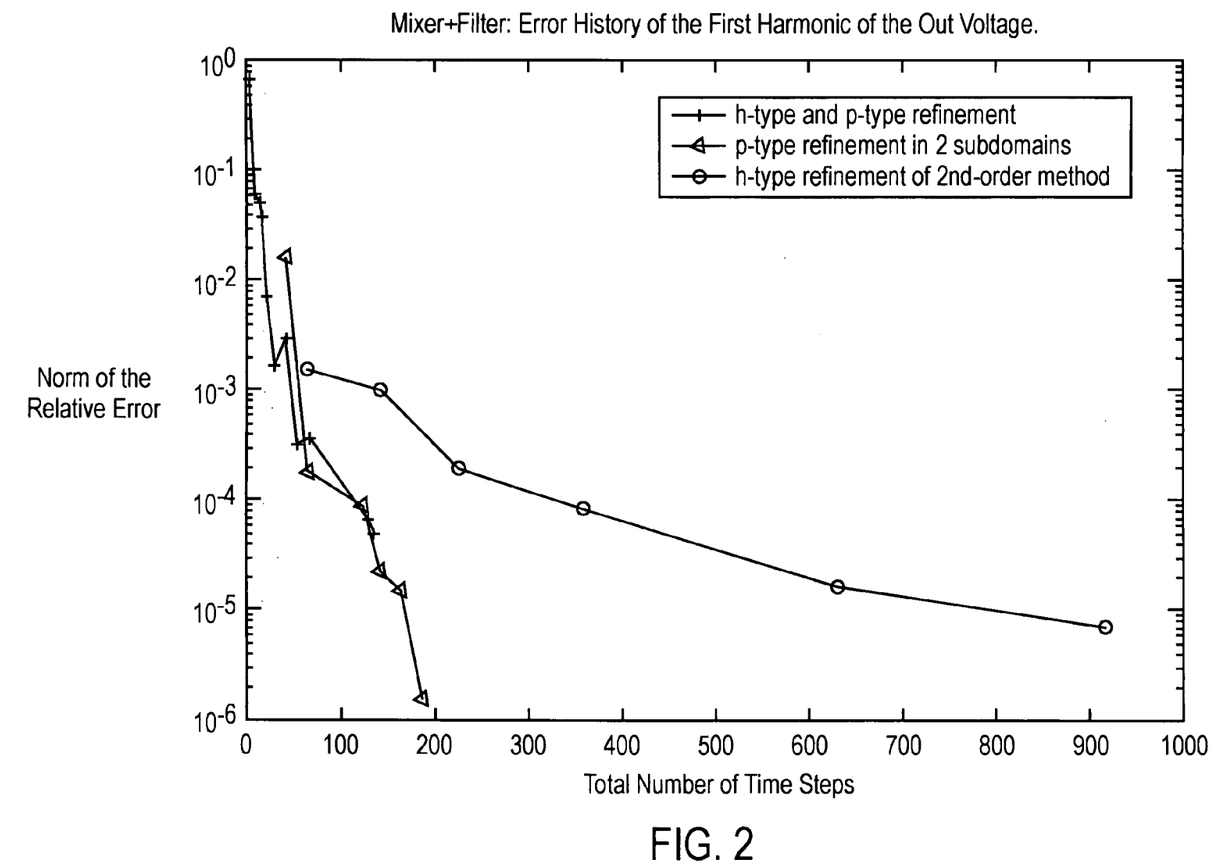
FIG. 2 is a graph showing a comparison of h-type, p-type, and hp-type refinement strategies, in accordance with one embodiment of the present invention.

FIG. 2 shows how both p-type refinement and hp-type refinement can achieve spectral accuracy, in accordance with one embodiment of the present invention. In the hp-type refinement, Chebyshev polynomials are used with an order varying from 2 to 16 in the intervals. The same level of accuracy is achieved that is achieved using p-type refinement where the order as high as 66 is used in two intervals. Note that for the same total number of time steps, the hp-type refinement is more efficient. One can see from FIG. 2 that both hp-type refinement and p-type refinement is superior to h-type refinement of a second order method. Advantages of using high-order methods are evident from this example.

In the last example, the periodic steady-state of a very nonlinear DC—DC converter is calculated, similar to a circuit analyzed in O. J. Nastov and J. K. White, "Time-Mapped Harmonic Balance," Proc. 36th Design Automation Conference, New Orleans, La., June, 1999. The final mesh of the proposed approach is obtained through three steps of hp-refinement.

By using both h-type and p-type refinement, the method selects high-order approximations, with large intervals, in the smooth region and low-order approximations, with small intervals, in the sharp-transition region.

Figure 3:
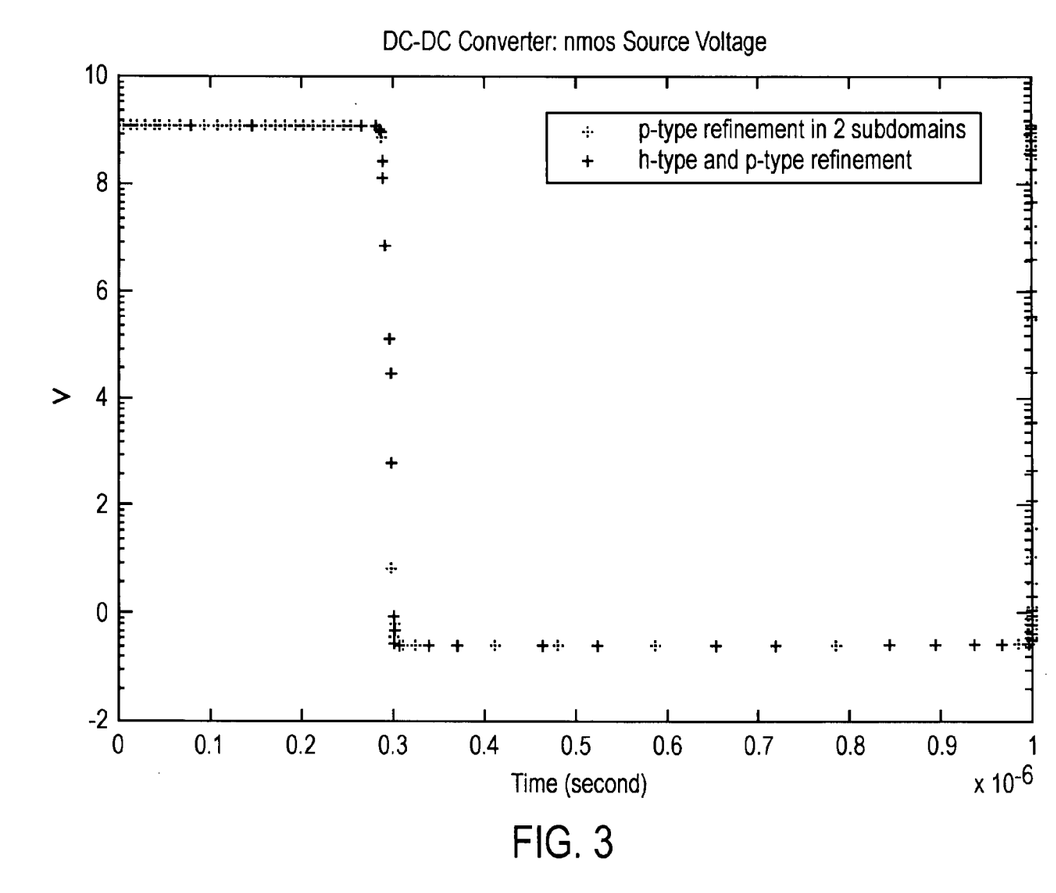
FIG. 3 is a graph showing waveforms obtained using collocation method with hp-type or p-type refinement, in accordance with one embodiment of the present invention.

FIG. 3 shows computed waveforms obtained using collocation method with hp-type or p-type refinement, in accordance with one embodiment of the present invention. The result is oscillation free and very accurate, as noted from the comparisons of the error in the output voltage presented in Table 1 below.

TABLE 1

DC-DC converter example. Error of the DC output voltage for hp-type high-order, p-type high-order, and low-order method.

| Method | # Time Steps | Relative Error |
|---|---|---|
| 2nd-order Gear | 2500 | 5.0372e−5 |
| p-type High-order | 128 | 8.7343e−2 |
| hp-type High-order (2–16) | 198 | 4.8453e−6 |

The second order Gear method requires two orders of magnitude more timepoints to reach comparable accuracy, while using global high-order basis functions, such as used in harmonic balance, leads to large errors. These large errors can be explained by examining the strictly high-order solution shown in FIG. 3, which shows about the best result obtainable using only p-type refinement in two intervals. Oscillation phenomena are visibly noticeable.

It is difficult to make precise comparisons of the efficiency of the method, because the shooting solution is used to achieve the initial mesh refinement, and because the cost varies depending on how many steps of mesh refinement are needed, the choice of approximation order in each subinterval, etc. However, the method of the present invention generally only uses 100–150% of the computation time of the initial low-order shooting-Newton guess to attain an accuracy of orders of magnitude higher. The GMRES iterative solver requires somewhat more GMRES iterations (usually between about 1 and 3 factors) per Newton iteration than the low-order shooting-Newton method. However, few Newton iterations beyond the shooting stage are typically required to reach convergence.

In the DC—DC converter example, the number of GMRES iterations required is only around 10, compared with hundreds or even thousands of iterations required by the harmonic balance method in O. J. Nastov and J. K. White, "Time-Mapped Harmonic Balance," Proc. 36th Design Automation Conference, New Orleans, La., June, 1999. More importantly, because many fewer timepoints are used to achieve high accuracy than other methods, the memory usage of our scheme, which is usually the limiting factor in determining capacity of an RF simulator, is potentially very much lower. As a study of efficiency on a larger example, what is used is the benchmark receiver circuit from R. Telichevesky, K. Kundert and J. K. White, "Efficient AC and Noise Analysis of Two-Tone RF Circuits," Proc. 33rd Design Automation Conference, June, 1996.

With the accuracy requirement at a fixed high precision (four digits in the fourth harmonic), the MIC method has shown a performance improvement over the low-order shooting-based method of 13× in CPU time and 20×in timepoint usage (proportional to memory). If instead the number of timepoints is fixed at a similar number in both methods, an additional 150% of the time of an initial low-accuracy shooting solution may be needed by the MIC method to increase the accuracy by 300×.

Therefore, in one embodiment, the present invention may be practiced as a method of simulating a circuit, the method comprising steps for defining a differential-algebraic equation of the circuit, defining a simulation time interval corresponding to the differential-algebraic equation, and dividing the simulation time interval into time intervals. The time intervals may include corresponding polynomials for each time interval, wherein each polynomial is a portion of an approximation to a desired solution of the differential-algebraic equation, and the method includes the step of applying a collocation method to discretize the differential-algebraic equation. In the method, the simulation time interval has collocation points, and wherein the interpolating polynomial has a degree of M, and the approximation to the desired solution of the differential-algebraic equations is $$I_M u(t) = \sum_{k=0}^{M} \tilde{u}_k T_k(t),$$

wherein M is the highest degree of the interpolating polynomials.

The invention may also be described as a method of simulating a circuit, the method comprising the steps of defining a differential-algebraic equation of the circuit, defining a simulation time interval corresponding to the differential-algebraic equation, dividing the simulation time interval into time intervals, wherein the time intervals have corresponding polynomials for each time interval, wherein each polynomial is a portion of an approximation to a desired solution of the differential-algebraic equation, and applying a collocation method to discretize the differential-algebraic equation. In the method, the simulation time interval has collocation points, and wherein the interpolating polynomial has a degree of M, the approximation to the desired solution of the differential-algebraic equations is $$I_M u(t) = \sum_{k=0}^{M} \tilde{u}_k T_k(t),$$

wherein M is the highest degree of the interpolating polynomials, and a derivative of the approximation is $$(I_M u)'(t) = \sum_{k=0}^{M} \tilde{u}'_k T_k(t).$$

In another embodiment, the present invention is a method of solving a set of differential-algebraic equations arising in a circuit simulation, the method comprising the steps of, applying a collocation method to each differential-algebraic equation to discretize the set of differential-algebraic equations; forming a solution to the set of differential-algebraic equations based on the discretized differential-algebraic equation, and determining an order of accuracy desired in each interval, wherein, the set of differential-algebraic equations comprises a set of boundary-value differential-algebraic equations, and wherein the boundary-value differential-algebraic equations are discretized in intervals, and wherein neighboring intervals share a boundary, and the solution in a particular interval is not smooth, and wherein the step of determining the order of accuracy desired in each interval comprises splitting the particular interval into at least two subintervals. The method may include that the set of differential-algebraic equations comprises a set of boundary-value differential-algebraic equations, and the boundary-value differential-algebraic equations include a first and a last interval.

In yet another embodiment, the present invention is a computer-readable medium carrying one or more sequences of one or more instructions for solving a set of differential-algebraic equations arising in a circuit simulation, the one or more sequences of one or more instructions including instructions which, when executed by one or more processors, cause the one or more processors to perform the steps of, applying a collocation method to each differential-algebraic equation to discretize the set of differential-algebraic equations, and forming a solution to the set of differential-algebraic equations based on the discretized differential-algebraic equation, wherein, the set of differential-algebraic equations comprises a set of boundary-value differential-algebraic equations, the boundary-value differential-algebraic equations are discretized in intervals, and wherein neighboring intervals share a boundary, the instructions further cause the processor to carry out the step of determining an order of accuracy desired in each interval, and the solution in a particular interval is not smooth, and wherein the step of determining the order of accuracy desired in each interval further causes the processor to carry out the step of splitting the particular interval into at least two subintervals. The computer-readable medium may include that the set of differential-algebraic equations comprises a set of boundary-value differential-algebraic equations, and the boundary-value differential-algebraic equations include a first and a last interval.

System and Method Implementation

Portions of the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits (ASIC's) or by interconnecting an appropriate network of conventional component circuits, as will be readily apparent to those skilled in the art.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MD's), optical discs, DVD, CD-ROMS, micro-drive, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing the present invention, as described above.

Included in the programming (software) of the general/specialized computer or microprocessor are software modules for implementing the teachings of the present invention, including, but not limited to, applying Chebyshev collocation to boundary-value differential equations to discretize a set of BVD equations, and forming a solution to the set of BVD equations based on the discretized BVD equation, according to processes of the present invention.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A computer implemented method of simulating a circuit, the method comprising:

defining a set of differential-algebraic equations of the circuit;
defining a simulation time interval corresponding to the differential-algebraic equations;
dividing the simulation time interval into time intervals, wherein the time intervals have corresponding polynomials for each time interval, wherein each polynomial is a portion of an approximation to a desired solution of the differential-algebraic equations; and
applying a collocation method to discretize the differential-algebraic equations;

wherein:

the simulation time interval has M collocation points, and wherein M represents a highest degree of interpolating polynomials;

determining a smoothness for each interval, increasing an order of a solution for an interval if it is smooth, and splitting the interval into at least two sub-intervals if the interval is not smooth;

solving the differential-algebraic equations in each of the intervals wherein approximation to the desired solution of the differential-algebraic equations is $$I_M u(t) = \sum_{k=0}^{M} \tilde{u}_k T_k(t),$$

wherein
$I_M$ represents an M-point interpolation operator,
u(t) represents a solution,
$u_k$ represents Fourier coefficients, and
$T_k(t)$ represents the interpolating polynomial.

2. The method of claim 1, wherein located at each collocation point $t_j$ is a value of $u(t_j)$ respectively, to be interpolated with polynomials.

3. A computer implemented method of simulating a circuit, the method comprising:

defining a set of differential-algebraic equations of the circuit;
defining a simulation time interval corresponding to the differential algebraic equations;
dividing the simulation time interval into time intervals, wherein the time intervals have corresponding polynomials for each time interval, wherein each polynomial is a portion of an approximation to a desired solution of the differential-algebraic equations; and
applying a collocation method to discretize the differential-algebraic equations;

wherein:

the simulation time interval has M collocation points, and M represents highest a degree of interpolating polynomials;

determining a smoothness for each interval, increasing an order of a solution for an interval if it is smooth, and splitting the interval into at least two sub-intervals if the interval is not smooth;

solving the differential-algebraic equations in each of the intervals wherein approximation to the desired solution of the differential-algebraic equations is $$I_M u(t) = \sum_{k=0}^{M} \tilde{u}_k T_k(t),$$

wherein
$I_M$ represents an M-point interpolation operator,
u(t) represents a solution,
$u_k$ represents Fourier coefficients,
$T_k$(t) represents the interpolating polynomial; and
a derivative of the approximation is $$(I_M u)'(t) = \sum_{k=0}^{M} \tilde{u}'_k T_k(t).$$

wherein
$u_k'$ represents the Fourier coefficients' derivative.

4. The method of claim 3, wherein each coefficient $u_k'$ is computed from $u_k$.

5. The method of claim 3, wherein the circuit is a radio frequency (RF) circuit.

6. The method of claim 1, wherein the step of applying the collocation method comprises applying Chebyshev collocation to discretize the set of differential-algebraic equation.

7. A computer implemented method of solving a set of differential-algebraic equations arising in a circuit simulation, the method comprising:
applying a collocation method to each differential-algebraic equation to discretize the set of differential-algebraic equations;
forming a solution to the set of differential-algebraic equations based on the discretized differential-algebraic equations; and
determining an order of accuracy desired in intervals of the differential algebraic equations to be solved in the simulation;
wherein:
the set of differential-algebraic equations comprises a set of boundary-value differential-algebraic equations, and wherein the boundary-value differential-algebraic equations are discretized in the intervals, and wherein neighboring intervals share a boundary; and
the solution in a particular interval is smooth, and wherein the step of determining the order of accuracy desired in each interval comprises determining whether to increase the order of accuracy of the particular interval.

8. The method of claim 7, wherein the set of differential-algebraic equations comprises at least one of: a set of initial-value differential-algebraic equations and a set of boundary-value differential-algebraic equations.

9. The method of claim 7, further comprising enforcing continuity of the solution at the boundary of neighboring intervals.

10. A computer implemented method of solving a set of differential-algebraic equations arising in a circuit simulation, the method comprising:
applying a collocation method to each differential-algebraic equation to discretize the set of differential-algebraic equations;
forming a solution to the set of differential-algebraic equations based on the discretized differential-algebraic equations; and
determining an order of accuracy desired in intervals of the differential algebraic equations to be solved in the simulation;
wherein:
the set of differential-algebraic equations comprises a set of boundary value differential-algebraic equations, and wherein the boundary-value differential-algebraic equations are discretized in the intervals, and wherein neighboring intervals share a boundary; and
the solution in a particular interval is not smooth, and wherein the step of determining the order of accuracy desired in each interval comprises splitting the particular interval into at least two subintervals.

11. The method of claim 10, wherein the circuit simulation is a radio frequency (RF) circuit simulation.

12. The method of claim 10, wherein the step of applying the collocation method comprises applying Chebyshev collocation to each differential-algebraic equation to discretize the set of differential-algebraic equations.

13. The method of claim 10, wherein the set of differential-algebraic equations comprises a set of boundary-value differential-algebraic equations discretized into intervals, and wherein the boundary-value differential-algebraic equation intervals include a first and a last interval.

14. The method of claim 13, further comprising enforcing a boundary condition at a boundary of the first and the last interval.

15. The method of claim 10, further comprising:
solving the set of differential-algebraic equations using a Newton-Raphson iterative method; and
in each Newton-Raphson step of the Newton-Raphson iterative method, solving a linear Jacobian system using a linear iterative method.

16. The method of claim 15, further comprising separately approximating for each interval a local preconditioner.

17. The method of claim 16, wherein the local preconditioner comprises at least one of: a capacitance matrix; and a conductance matrix.

18. A computer-readable medium carrying one or more sequences of one or more instructions for solving a set of differential-algebraic equations arising in a circuit simulation, the one or more sequences of one or more instructions including instructions which, when executed by one or more processors, cause the one or more processors to perform the steps of:
applying a collocation method to each differential-algebraic equation to discretize the set of differential-algebraic equations;
forming a solution to the set of differential-algebraic equations based on the discretized differential-algebraic equations; and
determining an order of accuracy desired in intervals of the differential algebraic equations to be solved in the simulation;
wherein:
the set of differential-algebraic equations comprises a set of boundary value differential-algebraic equations, and wherein the boundary-value differential-algebraic equations are discretized in the intervals, and wherein neighboring intervals share a boundary; and
the solution in a particular interval is not smooth, and wherein the step of determining the order of accuracy desired in each interval further causes the processors to carry out the step of splitting the particular interval into at least two subintervals.

19. The computer-readable medium of claim 18, wherein the set of differential-algebraic equations comprises at least one of: a set of initial-value differential-algebraic equations and a set of boundary-value differential-algebraic equations.

20. The computer-readable medium of claim 18, wherein the circuit simulation is a radio frequency (RF) circuit simulation.

21. The computer-readable medium of claim 18, wherein the step of applying a collocation method further causes the processors to carry out the step applying Chebyshev collocation to each differential-algebraic equation to discretize the set of differential-algebraic equations.

22. The computer-readable medium of claim 18, wherein the instructions further cause the processors to carry out the step of enforcing continuity of the solution at the boundary of neighboring intervals.

23. The computer-readable medium of claim 18, wherein the set of differential-algebraic equations comprises a set of boundary-value differential-algebraic equations discretized into intervals, and wherein the boundary-value differential-algebraic equation intervals include a first and a last interval.

24. The computer-readable medium of claim 23, wherein the instructions further cause the processors to carry out the step of enforcing a boundary condition at a boundary of the first and the last interval.

25. The computer-readable medium of claim 18, wherein the instructions further cause the processors to carry out the steps of:
    solving the set of differential-algebraic equations using a Newton-Raphson iterative method; and
    in each Newton-Raphson step of the Newton-Raphson iterative method, solving a linear Jacobian system using a linear iterative method.

26. The computer-readable medium of claim 25, wherein the instructions further cause the processors to carry out the step of separately approximating for each interval a local preconditioner.

27. The computer-readable medium of claim 26, wherein the local preconditioner comprises at least one of: a capacitance matrix; and a conductance matrix.

28. A computer-readable medium carrying one or more sequences of one or more instructions for solving a set of differential-algebraic equations arising in a circuit simulation, the one or more sequences of one or more instructions including instructions which, when executed by one or more processors, cause the one or more processors to perform the steps of:
    applying a collocation method to each differential-algebraic equation to discretize the set of differential-algebraic equations;
    forming a solution to the set of differential-algebraic equations based on the discretized differential-algebraic equations; and
    determining an order of accuracy desired in intervals of the differential algebraic equations to be solved in the simulation;
    wherein:
    the set of differential-algebraic equations comprises a set of boundary value differential-algebraic equations, and wherein the boundary-value differential-algebraic equations are discretized in the intervals, and wherein neighboring intervals share a boundary; and
    the solution in a particular interval is smooth, and wherein the step of determining the order of accuracy desired in each interval further causes the processor to carry out the step of determining whether to increase the order of accuracy of the particular interval.

29. A computer implemented method of simulating an RF circuit, comprising the steps of:
    determining a plurality of differential-algebraic equations describing operation of the RF circuit;
    determining a set of Chebyshev Gauss-Lobatto collocation points for the plurality of differential-algebraic equations, producing a set of intervals;
    discretizing each of the differential-algebraic equations based on the Chebyshev Gauss-Lobatto collocation point intervals;
    determining a smoothness for each interval, increasing an order of a solution for an interval if it is smooth, and splitting the interval into at least two sub-intervals if the interval is not smooth;
    solving the differential-algebraic equations in each of the intervals; and
    simulating the RF circuit based on the solved intervals.

30. The method according to claim 29, further comprising the steps of:
    enforcing continuity of the solution at each interval boundary; and
    enforcing a periodic boundary condition at each first and last interval boundaries.

31. A computer implemented method of simulating an RF circuit, comprising the steps of:
    determining a plurality of differential-algebraic equations describing operation of the RF circuit;
    determining a set of Chebyshev Gauss-Lobatto collocation points for the plurality of differential-algebraic equations, producing a set of intervals;
    discretizing each of the differential-algebraic equations based on the Chebyshev Gauss-Lobatto collocation point intervals;
    solving the differential-algebraic equations in each of the intervals; and
    simulating the RF circuit based on the solved intervals;
    wherein the step of solving comprises applying a set of at least one high order solution to at least one of the intervals and applying at least one solution from a set of low order solutions to a plurality of the intervals.

32. The method according to claim 31, wherein the step of solving comprises applying a set of solutions comprising more low order solutions than high order solutions.

33. The method according to claim 31, further comprising the steps of:
    dividing the intervals into smooth and non-smooth intervals, applying higher order solutions to the smooth intervals, and applying lower order solutions to the non-smooth intervals.

34. A computer implemented method of simulating an RF circuit, comprising the steps of:
    determining a plurality of differential-algebraic equations describing operation of the RF circuit;
    determining a set of Chebyshev Gauss-Lobatto collocation points for the plurality of differential-algebraic equations, producing a set of intervals;
    discretizing each of the differential-algebraic equations based on the Chebyshev Gauss-Lobatto collocation point intervals;
    solving the differential-algebraic equations in each of the intervals; and
    simulating the RF circuit based on the solved intervals;
    wherein the Chebyshev Gauss-Lobatto collocation points produce a small number of intervals in areas in which the differential-algebraic equations exhibit high convergence, and a large number of intervals in areas where the differential-algebraic equations exhibit low convergence.

35. The method according to claim 34, wherein the step of solving comprises dividing the intervals into smooth and non-smooth intervals, applying higher order solutions to the smooth intervals, and applying lower order solutions to the non-smooth intervals.

36. A computer implemented method of simulating a circuit, comprising the steps of:
- determining a plurality of differential-algebraic equations describing operation of the circuit;
- determining a set of collocation points for the plurality of differential-algebraic equations, producing a set of intervals comprising at least one high convergence interval and a plurality of low convergence intervals;
- applying a higher order solution in the at least one high convergence interval;
- applying a lower order solution in the low convergence intervals; and
- simulating the circuit response using the higher and lower order solutions.

37. The method according to claim 36, wherein the collocation points comprise Chebyshev Gauss-Lobatto collocation points.

38. The method according to claim 36, further comprising the steps of: enforcing continuity of the solutions at each interval boundary; and enforcing a periodic boundary condition at each first and last interval boundaries.

39. The method according to claim 36, further comprising the steps of:
- enforcing continuity of the solutions at each interval boundary; and
- enforcing a periodic boundary condition at at least one of the first and last interval boundaries.

40. The method according to claim 36, wherein more low order solutions are applied to the differential-algebraic equations than high order solutions.

* * * * *